(12) United States Patent
Cho

(10) Patent No.: US 7,298,783 B2
(45) Date of Patent: Nov. 20, 2007

(54) METHOD OF COMPRESSING SOUNDS IN MOBILE TERMINALS

(75) Inventor: Gyoun-Yon Cho, Seoul (KR)

(73) Assignee: Pantech Co., Ltd, Seoul (KR)

( * ) Notice: Subject to any disclaimer, the term of this patent is extended or adjusted under 35 U.S.C. 154(b) by 854 days.

(21) Appl. No.: 10/661,297

(22) Filed: Sep. 12, 2003

(65) Prior Publication Data

US 2004/0077342 A1 Apr. 22, 2004

(30) Foreign Application Priority Data

Oct. 17, 2002 (KR) ................ 10-2002-0063541

(51) Int. Cl.
*H04B 14/06* (2006.01)
*G10L 19/00* (2006.01)

(52) U.S. Cl. .................... 375/244; 704/212

(58) Field of Classification Search ............... 375/244, 375/242, 253; 704/212, 211, 201, 200, 503, 704/504; 381/34; 341/143
See application file for complete search history.

(56) References Cited

U.S. PATENT DOCUMENTS

| | | | | |
|---|---|---|---|---|
| 4,437,087 | A | * | 3/1984 | Petr ............................. 341/51 |
| 5,153,913 | A | * | 10/1992 | Kandefer et al. ........... 704/260 |
| 6,018,520 | A | * | 1/2000 | Okada ........................ 370/336 |
| 6,085,079 | A | * | 7/2000 | Tabeta ........................ 455/403 |

FOREIGN PATENT DOCUMENTS

| | | |
|---|---|---|
| GB | 2 339 644 A | 2/2000 |
| JP | 2255977 | 10/1990 |
| JP | 2271723 | 11/1990 |
| JP | 9069785 | 3/1997 |
| KR | 1997-0056108 | 7/1997 |
| KR | 144633 | 4/1998 |
| KR | 2000-0031184 | 5/2000 |
| KR | 2001-0066401 | 7/2001 |
| KR | 2002-0097389 | 12/2002 |

OTHER PUBLICATIONS

Shamoon et al., "A Rapidly Adaptive Lossless Compression Algorithm for High Fidelity Audio Coding", Mar. 29-31, 1994, Proceedings of Data Compression Conference, 1994. pp. 430-439.*

(Continued)

*Primary Examiner*—Mohammed Ghayour
*Assistant Examiner*—Vineeta Panwalkar
(74) *Attorney, Agent, or Firm*—Ohlandt, Greeley, Ruggiero & Perle L.L.P.

(57) ABSTRACT

A method of compressing sounds in mobile terminals according to the present invention transforms pulse code modulations (PCM) codes, which are source data of bell sounds using recorded sounds or voice memos and are generated by sampling the sounds, through applying a differential method and, then, compresses the PCM codes using Lempel Ziv Welch (LZW) compresses technique, thus reducing a storage space required for storing bell sounds using sounds or voice memos in mobile terminals. According to the present invention, compression efficiency is maximized upon using LZW algorithm by transforming PCM code through applying differential method, thereby increasing restoration efficiency of original sounds and heightening compression efficiency by about 50%, compared with the existing compression storage method using ADPCM.

3 Claims, 6 Drawing Sheets

OTHER PUBLICATIONS

European Search Report, application No. 03 020 105.7, dated Oct. 24, 2003.

Gyoun-Yon Cho, et al.; "*On the efficient compression algorithm of the voice traffic*"; 2nd Asia-Pacific Conference on Communications, Proceedings of Asia-Pacific Conference on Communications. APCC'95, Osaka, Japan, Jun. 13-16, 1995, pp. 166-170 vol. 1.

"*Principle and Technology of Digital Communication*", pp. 85-87, Oct. 31, 1999.

Text of Examiner's Written Opinion (2 pps) from corresponding Chinese Application No. 03160040.9 referring to article titled "Principle and Technology of Digital Communication".

* cited by examiner

| code word | outputted code word bit | decimal value |
|---|---|---|
| 0 | 000000000 | 0 |
| 1 | 000000001 | 1 |
| 2 | 000000010 | 2 |
| ⋮ | ⋮ | ⋮ |
| 273 | 100010001 | 273 |
| 274 | 1000100100 | 548(274+274) |
| 275 | 1000100110 | 549(274+275) |
| ⋮ | ⋮ | ⋮ |
| 749 | 1111111111 | 1023(274+749) |

METHOD OF COMPRESSING SOUNDS IN MOBILE TERMINALS

CROSS REFERENCE TO RELATED APPLICATIONS

The present application is claiming priority of Korean Patent Application No. 10-2002-0063541 dated Oct. 17, 2002.

BACKGROUND OF THE INVENTION

1. Field of the Invention

The present invention relates to a method of compressing bell sounds using recorded sounds and voice memos (hereinafter, referred to 'sounds') in mobile terminals and, more particularly, to a method of compressing sounds in mobile terminals, which compresses pulse code modulation (PCM) code generated by sampling sounds, using Lempel Ziv Welch (LZW) compression technique by applying a differential method.

2. Description of the Related Art

Generally, mobile terminals use Musical Instrument Digital Interface (MIDI) or recorded bell sounds in order to inform users of phone calls. MIDI bell sounds have been developing from existing mono-poly sounds to poly-poly sounds, and the recorded bell sounds use recorded music or voice to satisfy personal taste. Also, mobile terminals store voices so as to store details of the calling during on the line or to leave a memo during call waiting.

Presently, a method of storing sounds including bell sounds and voice memos used in mobile terminals uses a method of storing sounds using Adaptive Differential Pulse Code Modulation (ADPCM) compression algorithm without using sounds coder/decoder (CODEC) for supporting high tone quality provided by mobile terminals. Such ADPCM compression algorithm can reduce a storage space by about half level, but it cannot resist a degradation of tone quality.

In the existing method of storing sounds, voices are stored by transforming data sampled into PCM using ADPCM. PCM algorithm has been disclosed in International Telecommunications Union-Telecommunication Standardization Sector (ITU-T) G.711 Recommendations and ADPCM algorithm has been disclosed in ITU-T G.721 Recommendations.

The sounds storage method using the existing ADPCM described above has been improved, but it still has problems in that memories are excessively consumed and original sounds cannot be restored as they are because the method uses compression technique causing damage of source data.

SUMMARY OF THE INVENTION

Accordingly, the present invention has been made to solve the above-mentioned problems occurring in the prior art, and an object of the present invention is to provide a method of compressing sounds, which increases compression efficiency by transforming input data to be suitable for LZW compression algorithm through applying differential method to PCM code generated by sampling sounds.

In order to achieve at least the above objects, in whole or in parts, there is provided a method of compressing sounds in mobile terminals, including: initializing differential code corresponding to difference between adjacent PCM codes among PCM codes generated by sampling input sounds, in a dictionary table; sequentially reading PCM codes generated by sampling actually inputted input sounds, transforming the PCM codes into corresponding differential codes initialized in the dictionary table, and outputting the differential codes; and registering the outputted differential codes in a dictionary through dictionary generation algorithm.

Preferably, in initializing the differential codes in the dictionary table, the differential codes are 6-bit differential codes and the number of the differential codes is 64.

Preferably, said sequentially reading the PCM codes, transforming the PCM codes into differential codes, and outputting the differential codes includes: producing differential code variables that are differences between previously read PCM code and presently read PCM code; and differently outputting the differential codes according to the produced differential code variables' values.

Preferably, in said differently outputting the differential codes according to the produced differential code variables' values, if the produced differential code variables' values are in a certain range, the differential code variables are outputted as they are, on the other hand, if the produced differential code variables' values are not in the certain range, the differential code variables are transformed and outputted.

Preferably, the certain range is a range that the produced differential code variables' values are equal to or more than 0 and less than 31.

Preferably, if the produced differential code variables' values are not in the certain range, the differential code variables are classified again according to the values of differential code variables, and the corresponding differential code variables are transformed in different manners according to the classified values and outputted.

BRIEF DESCRIPTION OF THE FIGURES

The above and other objects, features and advantages of the present invention will be more apparent from the following detailed description taken in conjunction with the accompanying drawings, in which.

DETAILED DESCRIPTION OF THE INVENTION

Hereinafter, preferred embodiments of the present invention will be described with reference to the accompanying drawings.

Figure 1:
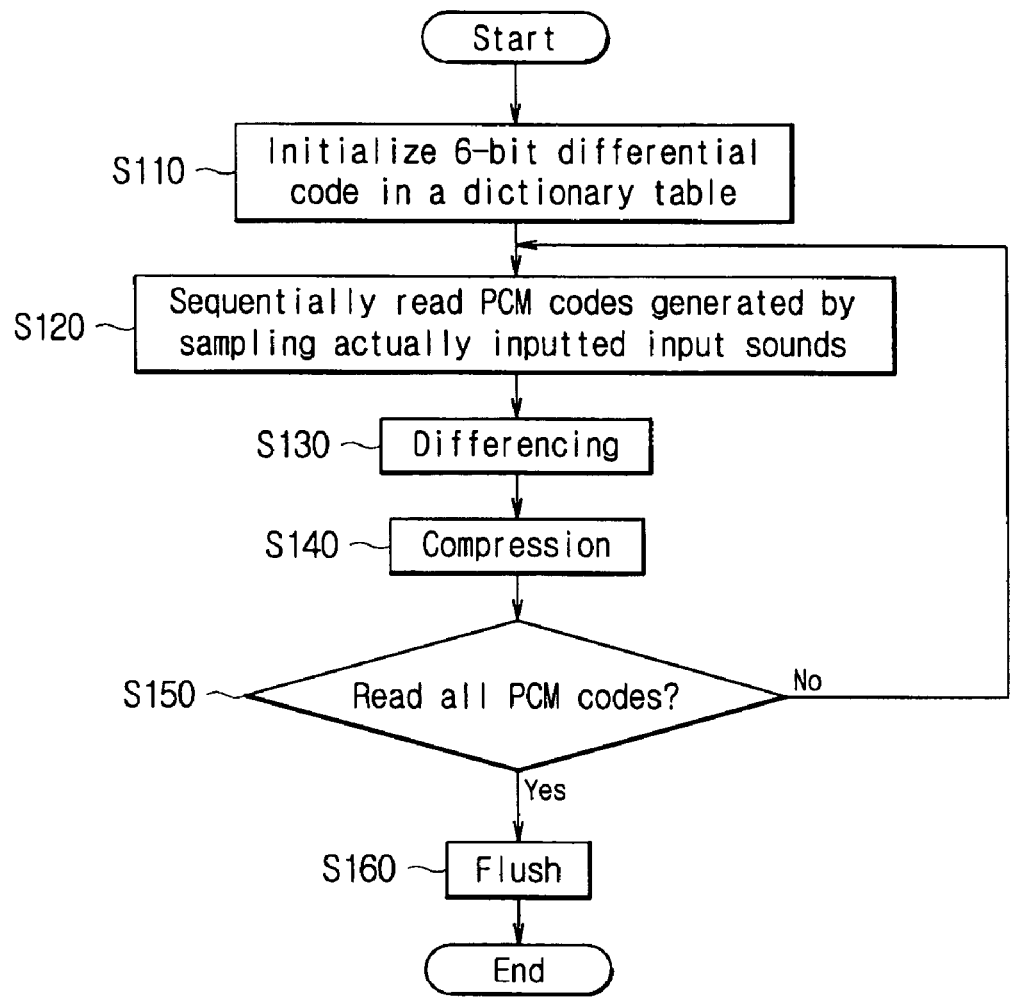
FIG. 1 is a flow chart of processes for sound compression in mobile terminals according to one preferred embodiment of the present invention.

FIG. 1 is a flow chart of processes for sound compression in mobile terminals according to one preferred embodiment of the present invention, whose first process is to initialize 64 code words for 6-bit differential code in a dictionary table (S110).

That is to say, as a result of analysis of PCM code obtained by sampling the recorded sounds in order to construct a code word required for sounds compression, the difference between neighboring PCM codes (the absolute value of a certain value obtained by subtracting one PCM code from neighboring PCM code) is less than 32, so that only 64 code words that may be generated are stored in the dictionary table as differential codes, and code word variable (C1), which indicates the next code word to be registered, is initialized as the number of N5 (N5=65), which is initial dictionary entry number.

Then, the stored PCM codes are sequentially read one by one (S120). The read PCM codes are processed with differencing so as to be mapped into 64 differential codes initialized in the dictionary table (S130). The differential codes after differencing are outputted to a function of compression (S140).

According to the function of compression, the differential codes are compressed by using dictionary generation algorithm and the compressed code words are outputted and stored in a memory. At this time, the dictionary generation algorithm generates dictionary trees suitable for the differential codes.

The steps (S120, S130 and S140) are repeated until all the PCM codes obtained by sampling are read (S150).

Then, when the differencing and compressing of all the PCM codes are completed, a flush is finally conducted (S160). According to a storage method in a memory, data is stored by 8-bit or 16-bit. Since the number of bits of compressed data is variable, final data stored in a memory may not correspond to 8-bit or 16-bit. Thus, bits left are filled with 0 and the above process is called 'flush'.

Respective processes of sound compression will be described in detail with reference to the drawings.

Figure 2:
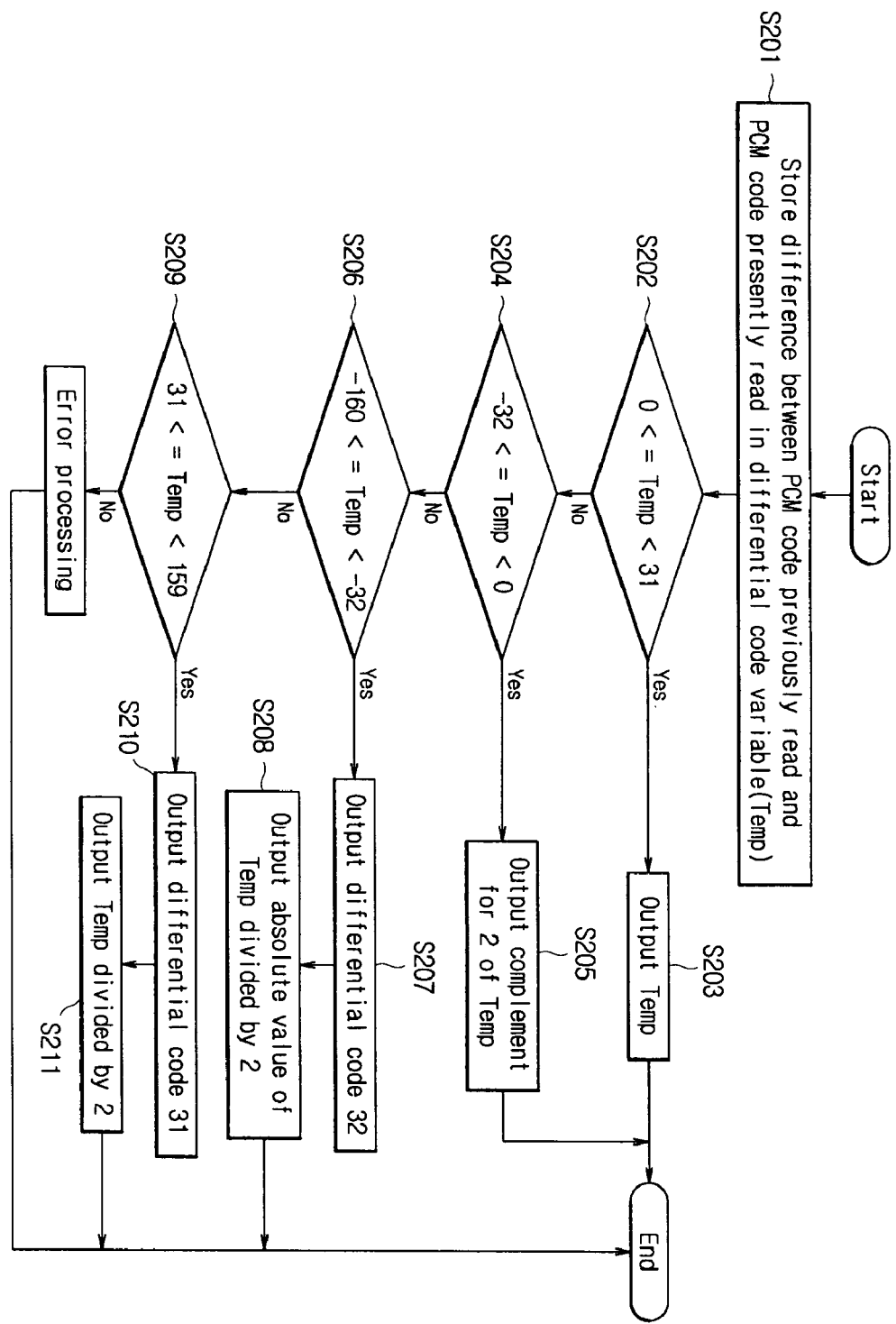
FIG. 2 is a flow chart of differencing process illustrated in FIG. 1.

FIG. 2 is a flow chart of a process for differencing the PCM codes (S130).

Referring to FIG. 2, the corresponding differencing process is to transform 8-bit PCM code into 6-bit differential code, wherein PCM code previously read (old) is subtracted by PCM code presently read (cur) so as to obtain the differential value of PCM code, and the subtracted value is stored in differential code variable (temp) (S201).

Then, it is checked whether or not the value of differential code variable is within a range of initialized differential codes so as to map input sounds into 64 differential codes initialized in the dictionary table, using the differential code variable.

For example, if the value of differential code variable ranges from 0 to 31 (31 is not included) (S202), the corresponding differential code variable is outputted as a differential code because the corresponding code variable is a differential code initialized in the dictionary table (S203). And, if the value ranges from −32 to 0 (0 is not included) (S204), 6-bit complement for 2 of differential code variable is outputted as differential code (S205).

However, when the value of differential code variable exceeds the range of differential code initialized in the dictionary table, differential code variable goes through a certain processing. When the value of differential code variable ranges from −160 to −32 (−160 is not included) (S206), differential code 32 is outputted in order to indicate that the value of differential code variable is less than −32 and, then, an absolute value of the corresponding differential code variable divided by 2 is outputted as differential code (S207 and S208).

When differential code variable ranges from 31 to 159 (159 is not included) (S209), differential code 31 is outputted in order to indicate that the corresponding differential code variable exceeds 31 and, then, a value of the corresponding differential code variable divided by 2 is outputted as differential code (S210 and S211).

Figure 3:
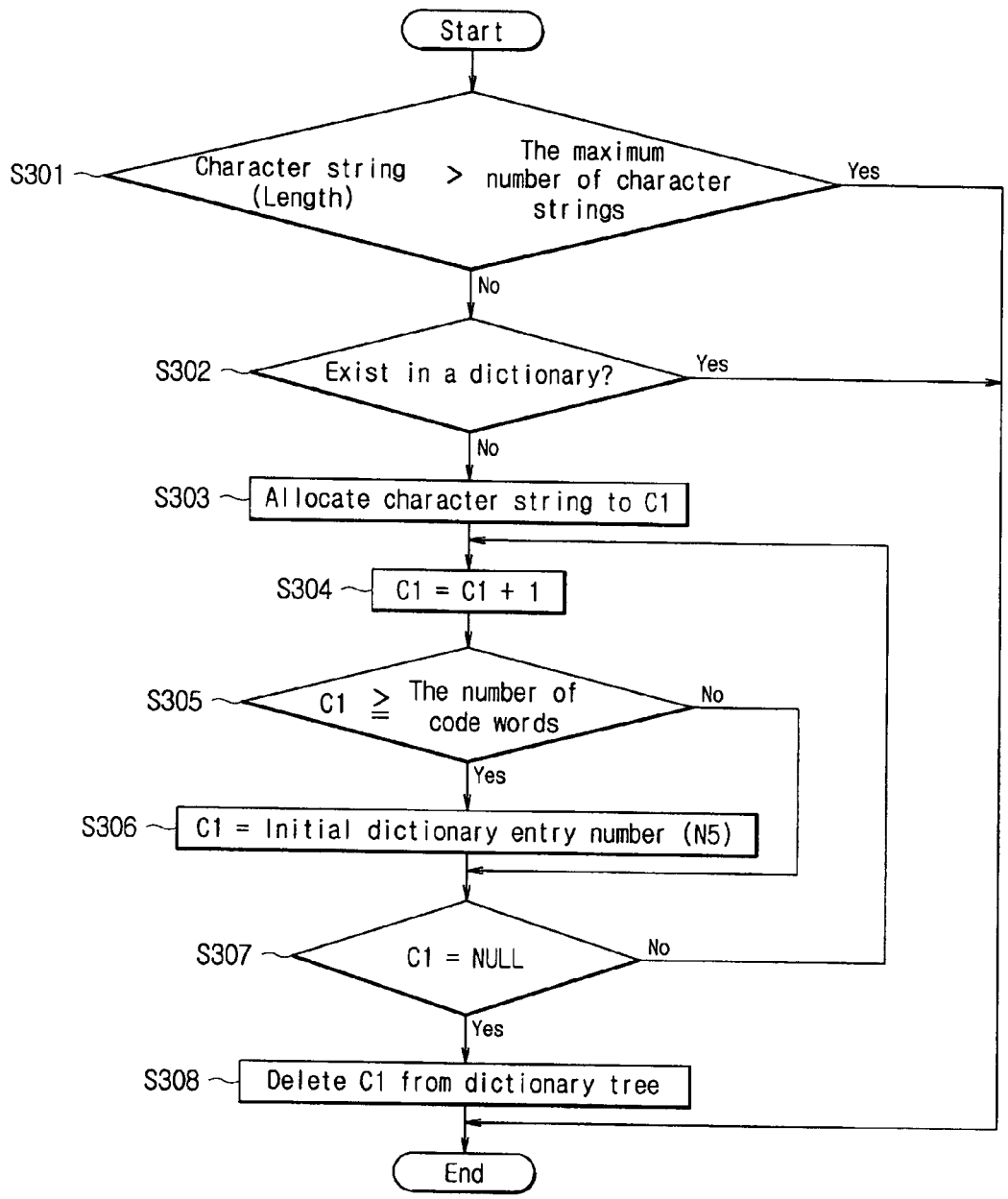
FIG. 3 is a flow chart of dictionary generation function in the compressing process illustrated in FIG. 1.

FIG. 3 is a flow chart showing a step (S140) of compressing differential code transformed by the differencing process, using dictionary generation algorithm. A dictionary generated for compressing differential code can be previously generated upon fabricating mobile terminals or upon initially storing sounds.

Referring to FIG. 3, a case where a character string is not added to the dictionary is one where the character string exceeds the maximum number (N7) of character string (S301) or where the character string is previously registered in the dictionary (S302). The character string is allocated to a new code word C1 except upon the above two cases (S303).

Then, new code word C1 increases by 1 so as to be allocated to the code word of character string to be generated next (S304). When the increased C1 is equal to or more than the number of code word (N2) (S305), the number of N5, initial dictionary entry number, is allocated to the C1 (S306). The steps (S304 to S306) are repeated until a node allocated to the C1 is a leaf node indicating last character of the character string in the dictionary tree, or a node that is not used (C1=NULL) (S307).

Where the node allocated to the C1 is a leaf node or the node that is not used, C1 is deleted from the dictionary tree in order for new code word of the character string to be allocated (S308).

When the compression has been completed through the above steps, generated code word is outputted and stored in a memory. To reduce the size of compressed code word, a process is conducted as follows. That is to say, in order to obtain accurate character string when decompressing the compressed code word, the corresponding code word is outputted as to satisfy the following equations.

$$(C1+lim) \leq 2^{\lceil log_2(C1+1) \rceil} - 1 \quad \text{[equation 1]}$$

$$lim = C3 - C1 - 1 \quad \text{[equation 2]}$$

$$C3 = 2^{\lceil log_2(C1+1) \rceil} \quad \text{[equation 3]}$$

where C1 is the number of code word presently allocated, lim means a limit value capable of reducing bits, and $\lceil log_2(C1+1) \rceil$ means minimum integer larger than $log_2(C1+1)$. Accordingly, when code word is changed into bit string, if the code word is smaller than a predetermined limit value lim, it is outputted as $\lceil log_2(C1+1) \rceil - 1$ bit, and if the code word is larger than a limit value, it is outputted as $\lceil log_2(C1+1) \rceil$ bit.

Figures 4, 5:
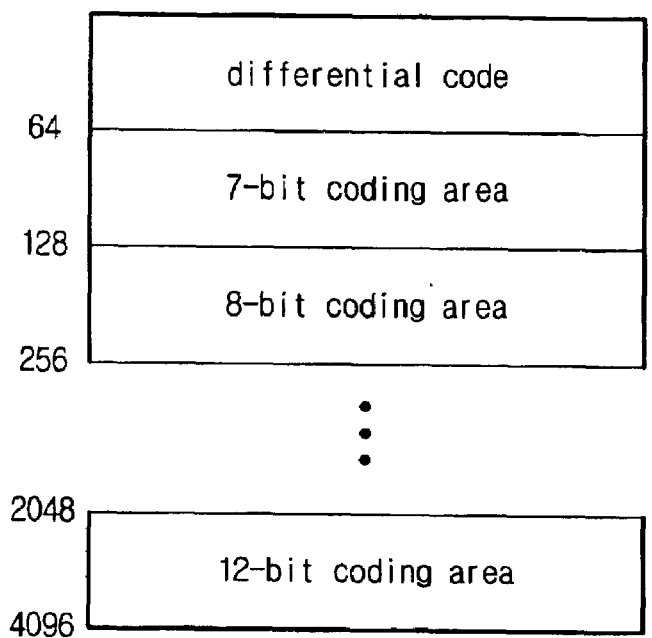
FIG. 4 illustrates output bit string of code word according to one preferred embodiment of the present invention.
FIG. 5 illustrates a structure of code word table of sound data according to one preferred embodiment of the present invention.

For example, as shown in FIG. 4, since lim=(1024−750−1)=273, when C1 is 750. Code words ranging 0 to 273 upon being compressed are coded by 9 bits and outputted, and code words ranging 274 to 749 are coded by 10 bits after adding 274 to respective code words and are outputted.

When decompressed, code word bits are read by 9 bits. If the read value is smaller than 274, the value itself is taken as a code word, on the other hand, if the value is larger than 274, code word bits are read again by 10 bits and a certain value subtracting 274 from the read value is taken as a code word.

FIG. 5 illustrates a structure of the dictionary table according to one preferred embodiment of the present invention. The code words ranging 0 to 63 are defined as differential code, code words ranging 64 to 127 as 7-bit coding area, code words ranging 128 to 255 as 8-bit coding area, and finally code words ranging 2048 to 4095 as 12-bit coding area.

In order to evaluate performance of the method of compressing sounds according to the present invention, compression algorithm is implemented using C language and tested. For sound data, actual human voice is recorded at 8000 samples per second (64 Kbps) and used.

Figure 6:
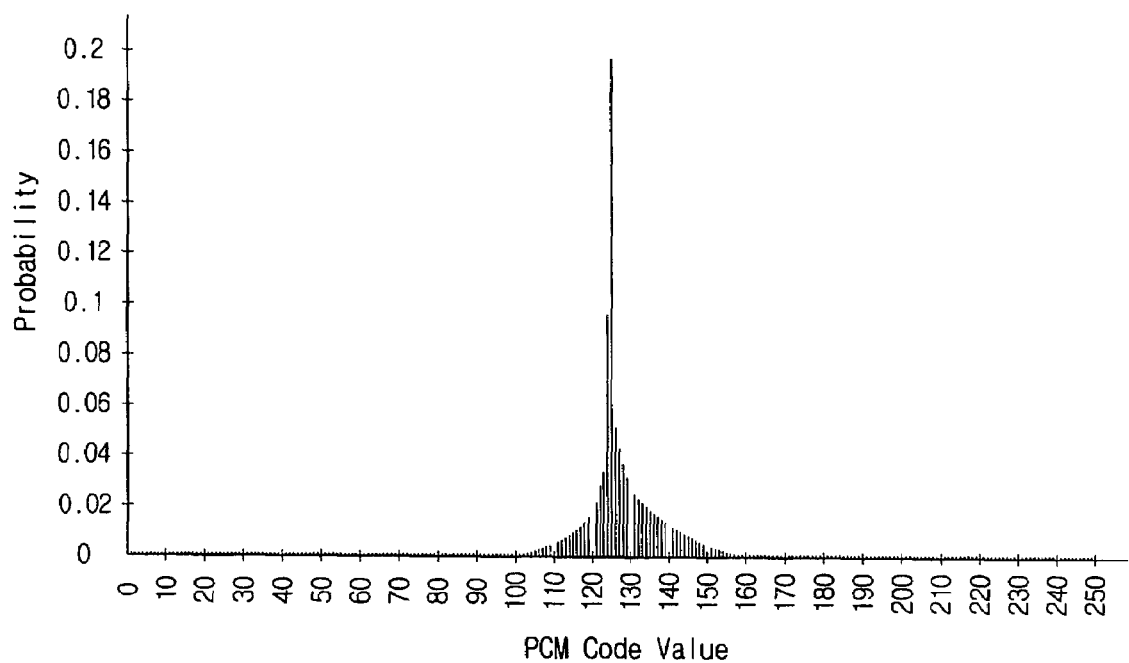
FIG. 6 illustrates the probability of PCM code of sampling sound data according to one preferred embodiment of the present invention.
Figure 7:
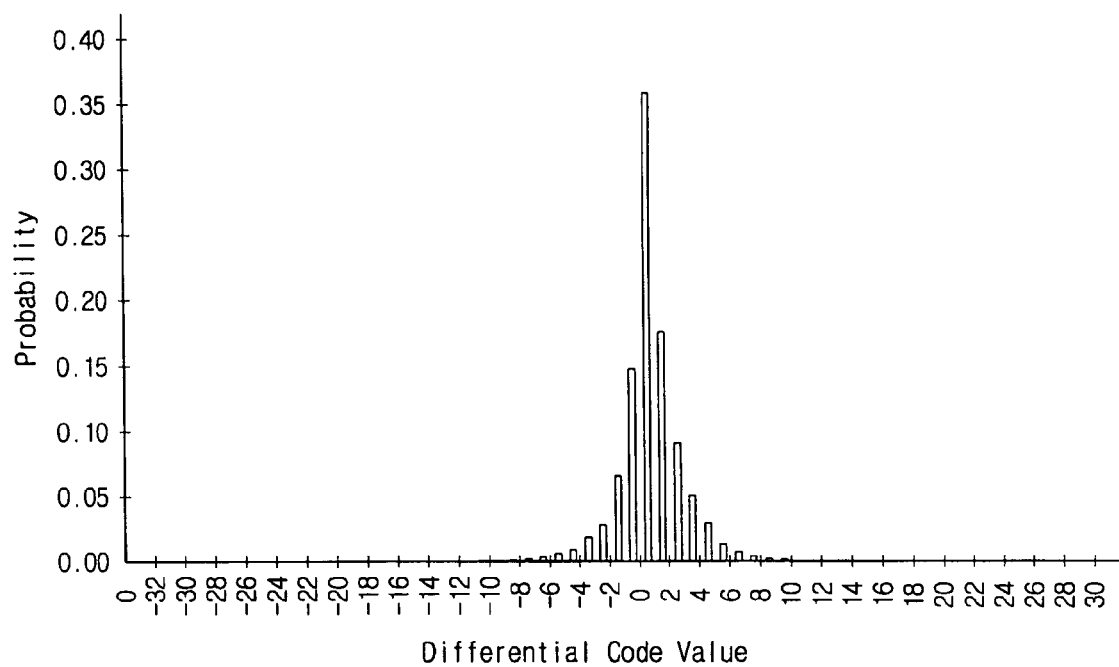
FIG. 7 illustrates the probability of differential code according to one preferred embodiment of the present invention.

FIG. 6 illustrates the probability of PCM code of sampling sound data, and FIG. 7 illustrates the probability of differential code, which records difference based on data from FIG. 6.

Compressibility of sounds according to the present invention is obtained by dividing the size of sounds data before compression by the size of sounds data after compression. With the result of this, samples 1 to 4 have compressibility of 3.00, 3.66, 3.35, and 2.5, respectively and average value of 3.13.

As described above, the present invention can reduce the number of kinds of code word, a parameter which heightens performance of LZW compression algorithm, by applying differential method to PCM code generated by sampling sounds and can enhance sound compression efficiency by increasing the number of repeated character string.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of compressing sounds in mobile terminals, comprising:

initializing a differential code corresponding to difference between adjacent PCM codes among PCM codes generated by sampling input sounds in a dictionary table;

sequentially reading PCM codes generated by sampling actually inputted input sounds, transforming the PCM codes into corresponding differential codes initialized in the dictionary table, and outputting the differential codes; and registering the outputted differential codes in a dictionary through a dictionary generation algorithm, wherein said sequentially reading the PCM codes, transforming the PCM codes into differential codes, and outputting the differential codes comprises:

producing differential code variables that are differences between a previously read PCM code and a presently read PCM code; and differently outputting differential codes according to the produced differential code variables' values in said differently outputting differential codes are according to the produced differential code variables' values wherein the differential code variables are outputted as they are when the produced differential code variables' values are in a certain range, and the differential code variables are transformed and outputted when the produced differential code variables' are not in the certain range.

2. The method of claim 1, wherein the certain range is a range that the produced differential code variables' values are equal to or more than 0 and less than 31.

3. The method of claim 1, wherein the differential code variables are classified again according to the values of differential code variables when the produced differential code variables' values are not in the certain range, and the corresponding differential code values are transformed in different manners according to the classified values and outputted.

* * * * *